United States Patent [19]

Scholz

[11] Patent Number: 5,392,210
[45] Date of Patent: Feb. 21, 1995

[54] METHOD FOR LOCATING THE POSITION OF ELECTROPHYSIOLOGICAL ACTIVITIES

[75] Inventor: Bernhard Scholz, Forchheim, Germany

[73] Assignee: Siemens Aktiengesellschaft, Munich, Germany

[21] Appl. No.: 924,978

[22] Filed: Aug. 5, 1992

[30] Foreign Application Priority Data

Aug. 16, 1991 [DE] Germany .................. 4126949

[51] Int. Cl.$^6$ .............................................. G06F 15/42
[52] U.S. Cl. .......................... 364/413.01; 364/413.13
[58] Field of Search ................... 364/413.01, 413.13, 364/413.19, 413.2, 413.21

[56] References Cited

U.S. PATENT DOCUMENTS 4,639,129 1/1987 Hullein et al. ........................ 356/5

FOREIGN PATENT DOCUMENTS 0359864 3/1990 European Pat. Off. .
0394662 10/1990 European Pat. Off. .
0449231 10/1991 European Pat. Off. .

OTHER PUBLICATIONS

"Probabilistic Methods in a Biomagnetic Inverse Problem," Clarke vol. 5, No. 6, Dec. 1989, pp. 999–1012.
"Multiple Dipole Modeling of Spatio-Temporal MEG Data," Mosher et al., Proceedings of SPIE Conference on Digital Image Synthesis and Inverse Optics, Jul. 1990, pp. 364–375.
"Basic Mathematical and Electromagnetic Concepts of the Biomagnetic Inverse Problem," Sarvas, Phys. Med. Biol., vol. 32, No. 1 (1987) pp. 11–22.
"Localization of Biological Sources with Arrays of Superconducting Gradiometers," Carelli et al., J. Appl. Phys. 59(2), Jan. 15, 1986, pp. 645–650.
"Application of Weight Functions to the Magnetic Localization of an Object," Mori, IEEE Trans. on Mag., vol. 25, No. 3 (1989), pp. 2726–2731.
"SQUID Arrays for Simultaneous Magnetic Measurements: Calibration and Source Localization Performance," Ribeiro et al., IEEE Trans. on Biomed. Eng., vol. 35, No. 7 (1988) pp. 551–560.

*Primary Examiner*—Robert A. Weinhardt
*Attorney, Agent, or Firm*—Hill, Steadman & Simpson

[57] ABSTRACT

A method for locating the position of endogenous, in vivo activities in an examination volume of a subject, by identifying the location in the examination volume of current dipoles generating an equivalent magnetic and electrical field, includes the formation of a probability density function on the basis of a objective function for one dipole model. From the probability density function, the dipole location is then calculated on the basis of a standardized anticipated position value, making use of the method of least squares. In this type of calculation, the structure of the objective function in the entire region of interest is taken into consideration. This prevents, in the method of least squares, the erroneous identification of local minimums instead of a global minimum. Moreover, the probability density function and the statistical variance supply useful additional information for interpreting the results.

11 Claims, 4 Drawing Sheets

METHOD FOR LOCATING THE POSITION OF ELECTROPHYSIOLOGICAL ACTIVITIES

BACKGROUND OF THE INVENTION

1. Field of the Invention

The present invention is directed to a method for identifying the location in an examination subject of endogenous, in vivo electrophysiological activities occurring in an examination volume.

2. Description of the Prior Art

The measurement, mapping and interpretation of electrical fields generated by electrophysiological activities have long been used in medical diagnostics in the form of electroencephalograms (EEGs) electrocardiograms (EKGs or ECGs). It is also known to measure the magnetic fields generated by such electrophysiological activities using biomagnetic measurement systems. Such systems operate on the principle of, from the measured data, calculating and displaying one or more current dipoles situated inside the examination volume which would generate the magnetic and electrical fields outside the examination volume, which have been measured.

The basic structure and components of such a biomagnetic measurement system are described, for example, in European Application 0 359 864. The extremely weak magnetic fields which are generated by electrophysiological activities are measured by a sensor arrangement, the sensor arrangement generally including a plurality of gradiometers arranged in an array. The position of the electrophysiological activity from which the magnetic fields emanate is identified in the examination volume by interpreting the output signals of the gradiometers. The position of equivalent current dipoles in the examination volume, which generate fields corresponding to the measured fields of the electrophysiological activities, is identified. Proceeding from the values of the magnetic field at a limited number of measuring volume points, therefore, location, strength and direction of the current dipoles must be calculated based on the measured field. This mathematical problem is solved on the basis of models for the biological tissue in the examination volume, and for the equivalent current sources which generate the external field.

In a known method, the solution is achieved using the method of the least squares as described, for example, in "Basic Mathematical and Electromagnetic Concepts of the Biomagnetic Inverse Problem," Sarvas, Physics in Medicine and Biology, Vol. 1932, 1987, pages 11-22. The fundamental parameters of a current dipole are its position in the examination volume and its magnetic moment. In this known method, the positions are entered non-linearly whereas the moments are entered linearly. The minimization of the function of the least squares (least-squares function) can be undertaken with respect to all parameters, or only with respect to the linear parameters. The least-squares function is also referred to as the objective function.

A first minimization method which is extremely intensive in terms of calculating time, is to search for the least-squares in the entire parameter space. This minimization method can supply solutions for a limited number of current dipoles. In practice, however, in order to avoid unreasonably long calculating times, one seeks a solution for a single current dipole. Moreover, the parameter space, which is otherwise six-dimensional, can be reduced by specific models of the examination volume. For cardiological examinations, the examination volume can be replaced by a uniform, conductive, infinite half-space, and for cerebral examinations, the examination volume can be replaced by a uniform, conductive sphere. In a one dipole model, the parameter space is then five-dimensional, and is ten-dimensional in a two dipole model.

A further reduction in the number of parameter can be achieved by introducing locally optimum current dipoles. The minimization of the objective function thereby ensues with respect to the linear parameters of the dipole moment by finding the solutions of a corresponding system of linear equations. Such linearization is discussed in the aforementioned article of Sarvas, and is also discussed in "Multiple Dipole Modeling of Spatic-Temporal MEG Data", Mosher et al., Proceedings of SPIE Conference on Digital Image Synthesis and Inverse Optics, Vol. 1351, July 1990, pp. 364–375. The linear equations connect the dipole moments and the measured values to the points of the measurement space. The solution can be considered in the so-called overdefined case and in the so-called underdefined case. The overdefined solution leads to the concept of locally optimum dipole moments. For each point of the examination volume, the moment of a current dipole situated at that point is defined such that the field generated at the points of the measurement volume by that current dipole best coincides with the field measured at the points of the measurement space.

Locally optimum dipole moments are dependent on the dipole positions. The target function can therefore be considered exclusively as a function of the space. The dimension of the parameter space is thus considerably reduced. This has useful consequences and enables an improvement of the localization algorithm. In a one dipole model, moreover, the entire function can be graphically portrayed in the region of interest.

The objective function F for pointlike sensors or detectors can be calculated on the basis of the following equation:

$$F = \frac{1}{2} \sum_{i=1}^{M} (b_i - m_i)^2 \quad (1)$$

In equation (1) $b_i$ is the theoretical or actual magnetic field component generated by a current dipole, $m_i$ is the measured magnetic field component along the normal of each detector, i.e., the field measured at the points of the measurement volume along the normals prescribed by the orientation of the detector, and M is the number of detectors or points of the measurement space. A objective function having locally optimum current dipole moments in the one dipole model is shown as an example in FIG. 1. As noted above, the minimum of the objective function with respect to the current parameters is sought for identifying the location of the dipole. In known iteration methods such as, for example, the Levenberg-Marquardt Algorithm, there is always the risk that a secondary minimum, such as point B in FIG. 1, rather than a global minimum, which is point A in FIG. 1, will be found.

SUMMARY OF THE INVENTION

It is an object of the present invention to provide a method for locating electrophysiological activities using a model consisting of a plurality of current dipoles wherein the location identification can be found within a reasonable calculating time.

It is a further object of the invention to provide such a method wherein misidentification of secondary minimums, rather than the true global minimum, is prevented.

The objects are achieved in a method including the following steps. First, the magnetic and/or electrical field is measured for a first plurality of measurement space points outside the examination volume using a like plurality of measuring channels. Next, a calculation of locally optimum current dipole combinations is undertaken, the calculation identifying respective current dipoles situated at respective ones of a second plurality of different examination volume points within the examination volume, and each dipole generating a magnetic and/or electrical field at the measurement space points which best coincides with the field actually measured at those measurement space points. Next, a least-squares function is then calculated on the basis of the locally optimum current dipole combinations. The least-squares function compares the field generated by the locally optimum current dipole combinations in the first plurality of spatial points with the measured field at these spatial points, with the least-squares function being only a function of spatial points in the examination volume. The exponential probability density function is then calculated, which will have a negative exponent containing the least-squares functions. Lastly, an anticipated location value of the current dipole combination is calculated on the basis of the probability density function. The anticipated location value is formed from the sum of the current dipole combinations standardized with the overall probability of the examination space points, weighted with the corresponding probability density function. The anticipated location value corresponds to the locations of the equivalent current dipoles in the examination region.

The fact that the locally optimum current dipole combinations are first defined produces the condition for implementing the localization of the equivalent current dipoles in a reasonable calculating time. Use of the exponential probability density function prevents misidentification of secondary minimums because the structure of the objective function in the entire examination space is taken into consideration.

In a further embodiment of the method, the denominator of the exponent of the probability density function is taken into account as an additional factor and determines the width of the probability density function. This denominator contains a quadratic measured value noise U amplitude identified over all measurement channels. Since the noise influences the probability density function, this factor can be taken into account for determining the localization error.

In a further embodiment, the field can be portrayed by a current dipole, and the locally optimum current dipole combinations each contain only one locally optimum current dipole. The limitation to a one dipole model considerably reduces the calculating time required for the identification of the parameters.

In a further embodiment the standard deviation is calculated from the second moment of the probability density function, the standard deviation being a measure of the error in the calculation of the location of the equivalent current dipole. Indication of the localization error supplies important information for diagnostic interpretation.

various characteristic quantities of the probability density function and the function itself can be graphically portrayed, to facilitate diagnosis by the physician.

DESCRIPTION OF THE PREFERRED EMBODIMENTS

Figure 1:
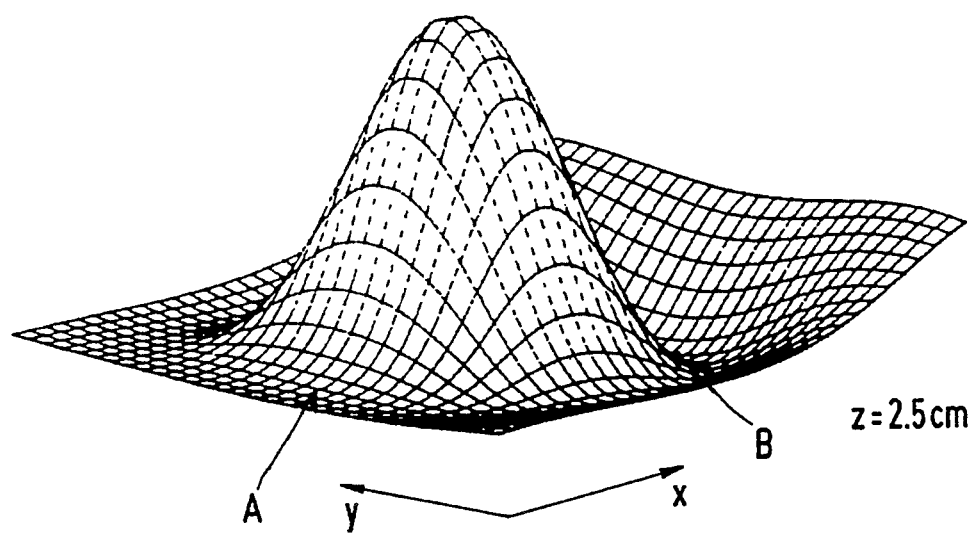
FIG. 1 is a three-dimensional plot of a typical objective function having locally optimum current dipole moments in a one dipole model.
Figure 2:
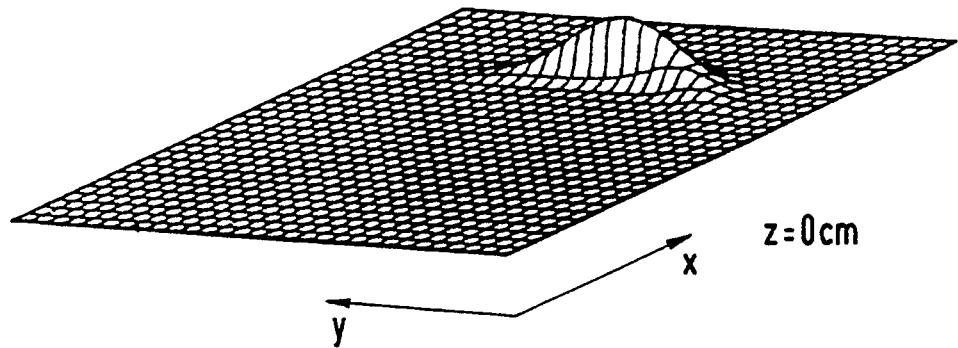
FIGS. 2 through 5 respectively show three-dimensional plots of the probability density function in the x–y plane for various depths in the z-direction, for use in explaining the method of the invention.
Figure 3:
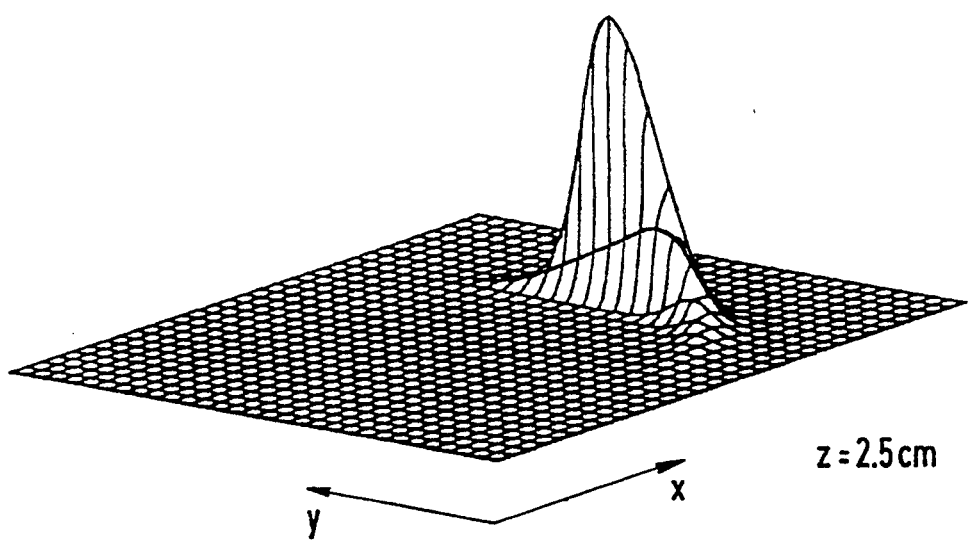
Figure 4:
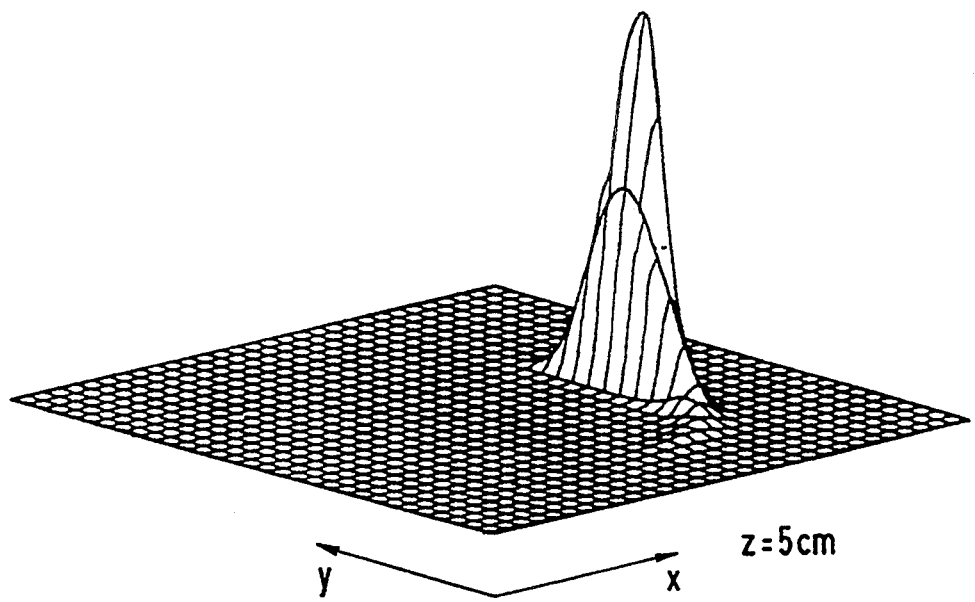
Figure 5:
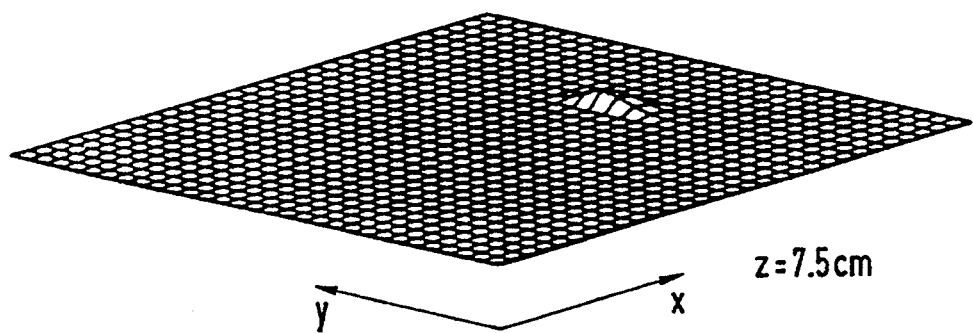

The exemplary embodiment described below is that of a one dipole model, because such a one dipole model provides the most easily visualized graphic presentation. Analogous concepts, however, apply to multi-dipole models or to a current dipole combination, with the only difference being that the dimension of the parameter space in those modes is correspondingly larger. For example, in a two dipole model the parameter space is six-dimensional and is nine-dimensional in a three dipole model.

The localization (position identification) method is based on probability calculations. The objective function is calculated relative to an imaginary grid covering the entire region of interest, or examination volume. As a result, the search for a minimum is global, additionally secondary minimums can be recognized. In the one dipole model, the search can be implemented without substantial calculating time.

The position of the global minimum of the objective function generally does not correspond to the position of the equivalent current dipole if the data are noisy. The "noise-free" minimum is shifted due to noise effects in the measurement channels. An algorithm for localization is therefore desirable wherein the dipole positions and moments are also identified by the structure of the objective function around the "noisy" minimum. The algorithm set forth below, therefore, also takes the noise in the measurement channels into consideration.

The location-dependent, non-Gaussian probability density function $g(\vec{x})$ of the location of the equivalent current dipole is derived from the objective function, which is only location-dependent, according to the following relationship:

$$g(\vec{x}) = \exp\left[ -\frac{1}{2} (F(\vec{x})/\sigma_N^2) \right]. \quad (2)$$

In equation (2), $\sigma^2_N$ is the squared measured value noise amplitude averaged over all measured value channels, and $F(\vec{x})$ is the objective function according to equation (1). The probability density function indicates a probability density value for the given examination volume points.

The location of the equivalent current dipole is the anticipated location value, which is calculated according to the following expression:

$$\langle \vec{x} \rangle = \frac{\sum_{i=1}^{N} \vec{x}_i \cdot g(\vec{x}_i)}{\sum_{i=1}^{N} g(\vec{x}_i)}. \qquad (3)$$

The angled brackets $\langle \rangle$ in equation (3) indicate the average of the enclosed threedimensional position vector, and N is the number of examination volume points. The summing in the region where the probability density function $g(\vec{x})$ differs from zero must be implemented using a sufficiently fine grid.

Further, an individual localization error can be identified on the basis of statistical fluctuations in the data. This is given by the localization standard deviation, which can be calculated from the second moment of the probability density function. The position variance along a j-axis is:

$$\sigma_j^2 = \langle x_j^2 \rangle - \langle x_j \rangle^2 \qquad (4)$$

wherein $$\langle x_j^2 \rangle = \frac{\sum_i x_{ji}^2 g(\vec{x}_i)}{\sum_i g(\vec{x}_i)}. \qquad (5)$$

In the equations (4) and (5), j represents the respective direction x, y or z, and correspondingly runs from 1 through 3. An overall variance which is independent of coordinate rotations is as follows:

$$\sigma^2 = \sum_{j=1}^{3} \sigma_j^2. \qquad (6)$$

The overall variance can be interpreted as a sphere surrounding the location of the current dipole.

The identified current dipole location can not only be portrayed, for example, in an anatomically tomogram on the basis of the above calculations, but also the probability density function can be presented, as shown in FIGS. 2 through 5, for various depths z in the examination region. As a result of such a display, the viewer sees not only the calculated location, but also the probability distribution. The viewer is thus informed of how reliable the identified current dipole location is. The disclosed method is thus more reliable and more predictive than conventional search methods for the minimum of the objective function. It is also possible to display only those regions wherein the probability density function exceeds a threshold. Another possibility is to chromatically code the acquired image in accordance with the respective value of the probability density function.

Further, the individual error can be numerically displayed for each localization.

A pre-selection of the relevant current dipole region on an initially coarser grid can be undertaken on the basis of the formation of the probability density function and the location, error and probability calculation can then be implemented on a finer grid in the selected region.

In simulation experiments, the exponential weighting with respect to the position yielded the following result: approximately 56% of the calculated dipole positions lie inside a sphere having the radius $\sigma$, approximately 97% lie in a sphere having the radius $2\sigma$, and more than 99.5% lie in a sphere having the radius $3\sigma$.

The described algorithm takes the structure of the objective function in the entire region of interest into consideration. As noted above, this was not the case in conventional, iterative localization methods. Such conventional methods find the local minimum in the region to which the starting point belongs. The stop criterion in the iteration is also met (if graphically visualized) by a slightly rising, annular valley, even given a non-minimum location. The structure of the objective function shown in FIG. 1 arises when the data are monopolar or quasi-polar, i.e., the field values have amplitudes predominantly of one polarity (positive polarity in FIG. 1). The more global consideration of the objective function in accordance with the principles of the present invention, together with the exponential weighting, avoids having the iteration reach a local minimum or "misperceiving" a minimum in a ring-like valley. The localization precision of the algorithm in accordance with the principles of the method disclosed herein is therefore limited only by the noise component in the measured values caused by the measurement channels.

For deeply disposed dipoles (i.e., dipoles disposed well within the interior of the examination volume), noise components flatten the objective function in a relatively large region around the true current dipole position. This often causes a considerable shift of the minimum of the objective function. Even if a conventional algorithm finds this shifted minimum, the result is incorrect. In the algorithm based on probability considerations disclosed herein, a flat objective function produces a broad weighting function. The anticipated position value therefore takes the structure of the objective function around the noise-defined minimum into consideration. The method disclosed herein therefore supplies better results for deeply disposed dipoles than do conventional algorithms.

Figure 6:
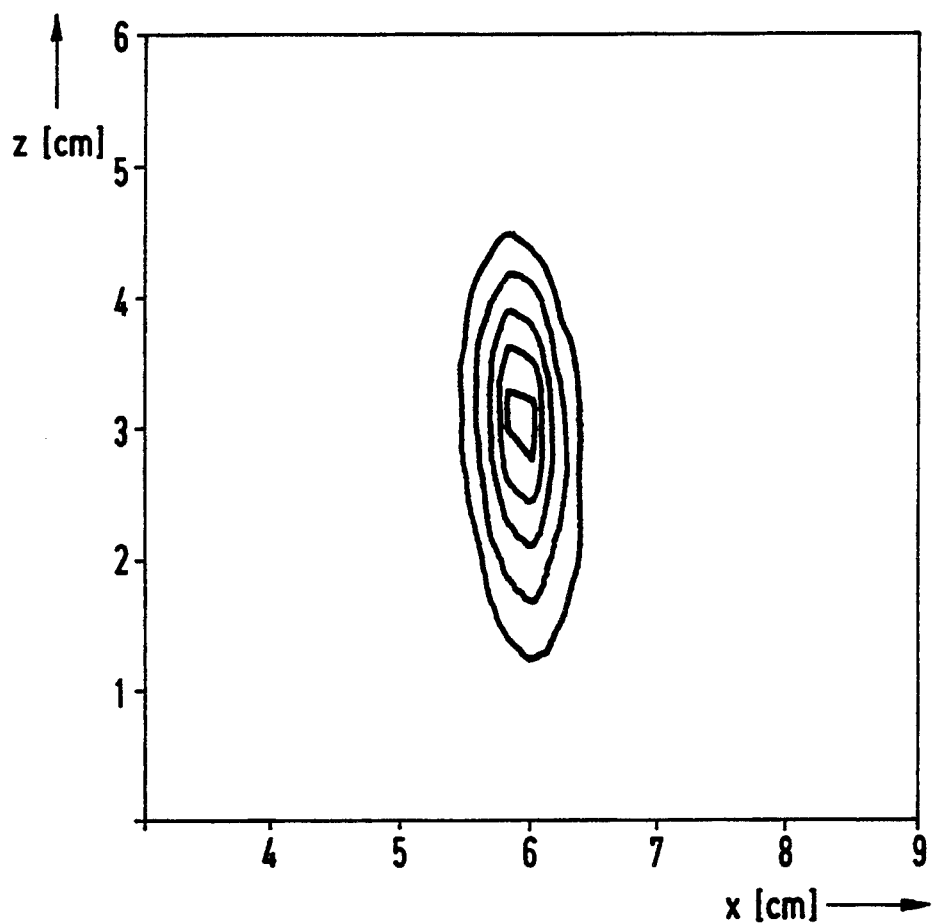
FIG. 6 is a contour plot of the probability density function in the x–z plane of the examination volume, for use in explaining the method of the invention.

A visual display of the probability density function, used in the method disclosed herein, in a plane of the examination volume with contour lines is shown in FIG. 6. The contour lines show locations at which the probability density function assumes specific values. The innermost line represents the highest value, and the outermost line represents the lowest value. The lines shown in FIG. 6 may, for example, have the values 0.95, 0.75, 0.50, 0.25 and 0.10 from inside to outside.

A chromatic presentation of the regions between the contour lines is highly visible in a black-white tomogram.

The measurements and displays described herein which are undertaken in accordance with the method disclosed herein can be physically implemented, for example, in a system such as disclosed in the aforementioned European Application 0 359 864.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for identifying the location of endogenous, in vivo electrophysiological activities which generate a measurable magnetic and electrical field outside of an examination volume which can be represented by equivalent current dipoles located inside said examination volume, said method comprising the steps of:

measuring at least one of said magnetic and electrical fields in a first plurality of measurement space points outside said examination volume using a like, first plurality of measuring channels;

calculating locally optimum current dipole combinations respectively situated at a second plurality of different examination space points within said examination volume which generate a magnetic or electrical field at said measurement space points best coinciding with the field measured at said measurement space points;

calculating a least-squares function on the basis of said locally optimum current dipole combinations which compares said field generated by said locally optimum current dipole combinations in said first plurality of measurement space points with said measured field at said measurement space points, said least-squares function being function only of said examination space points within said examination volume;

calculating an exponential probability density function having a negative exponent containing said least-squares function;

calculating an anticipated location value of each current dipole combination on the basis of said probability density function, by forming a sum of said examination space points weighted with the corresponding probability density function and standardized with the overall probability of said examination space points, each anticipated location value corresponding to the location of an equivalent current dipole in said examination region; and displaying the location of said equivalent current dipole combinations.

2. A method as claimed in claim 1 wherein each of said measurement channels has a noise amplitude associated therewith, and comprising the additional step of:

including a denominator of the exponent in said exponential probability density function containing a squared measured value of said noise amplitude averaged over all of said measurement channels.

3. A method as claimed in claim 1 wherein said electrophysiological activity is to be represented by a plurality of single, equivalent current dipoles, and wherein the step of calculating locally optimum current dipole combinations is further defined by calculating locally optimum current dipole combinations each consisting of only one locally optimum current dipole.

4. A method as claimed in claim 1 comprising the additional step of:

calculating the standard deviation from the second moment of said probability density function as a measure for the error in the identification of the location of said equivalent current dipoles.

5. A method as claimed in claim 1 comprising the additional step of graphically portraying said probability density function and said location of said equivalent current dipoles.

6. A method as claimed in claim 5 comprising the additional step of displaying a region of said probability density function which lies above a first threshold in contrast with a region of said probability density function lying below said first threshold.

7. A method as claimed in claim 6 comprising additional step of:

displaying only one region of said probability density function, said region lying above a second threshold.

8. A method as claimed in claim 1 comprising the additional steps of:

calculating the standard deviation from the second moment of said probability density function as a measure for the error in the identification of the location of said equivalent current dipoles; and graphically displaying said standard deviation.

9. A method as claimed in claim 8 comprising the additional step of displaying a region of said probability density function which lies above a first threshold in contrast with a region of said probability density function lying below said first threshold.

10. A method as claimed in claim 8 comprising additional step of:

displaying only one region of said probability density function, said region lying above a second threshold.

11. A method as claimed in claim 1 comprising the additional step of:

calculating the probability for a selected region of one of said equivalent current dipoles from said probability density function and numerically displaying said probability for a selected environment of said anticipated location value.

* * * * *